(12) United States Patent
Ware

(10) Patent No.: US 10,475,505 B2
(45) Date of Patent: Nov. 12, 2019

(54) STACKED SEMICONDUCTOR DEVICE

(71) Applicant: Rambus Inc., Sunnyvale, CA (US)

(72) Inventor: Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/872,840

(22) Filed: Jan. 16, 2018

(65) Prior Publication Data

US 2018/0211701 A1    Jul. 26, 2018

Related U.S. Application Data

(63) Continuation of application No. 15/175,933, filed on Jun. 7, 2016, now Pat. No. 9,881,663, which is a
(Continued)

(51) Int. Cl.
*G11C 11/4093* (2006.01)
*G11C 5/04* (2006.01)
(Continued)

(52) U.S. Cl.
CPC ............ *G11C 11/4093* (2013.01); *G11C 5/04* (2013.01); *G11C 11/4096* (2013.01);
(Continued)

(58) Field of Classification Search
CPC ............ G11C 7/10; H01L 2225/06541; H01L 21/76898
(Continued)

(56) References Cited

U.S. PATENT DOCUMENTS 5,585,675 A    12/1996  Knopf
6,177,296 B1    1/2001  Vindasius et al.
(Continued)

FOREIGN PATENT DOCUMENTS

JP    2009-129498    6/2009
KR    10-0832845    5/2008
(Continued)

OTHER PUBLICATIONS

Amir, Dudi et al., "3D Packaging, Interconnection & Assembly," 2013 Slidedeck downloaded from http://www.smta.org/chapters/files/Oregon_3D_Packaging_SMTA_CTP_2013_(Version_C).pdf. 196 pages.
(Continued)

*Primary Examiner* — Han Yang
(74) *Attorney, Agent, or Firm* — Lance Kreisman; Peninsula Patent Group

(57) ABSTRACT

A stacked semiconductor device is disclosed that includes a plurality of semiconductor dies. Each die has oppositely disposed first and second surfaces, with pads formed on each of the surfaces. A plurality of through-vias connect respective pads on the first surface to respective pads on the second surface. The through-vias include a first group of through-vias coupled to respective I/O circuitry on the semiconductor die and a second group of through-vias not coupled to I/O circuitry on the semiconductor die. The plurality of semiconductor dies are stacked such that the first group of through-vias in a first one of the plurality of semiconductor dies are aligned with respective ones of at least a portion of the second group of through-vias in a second one of the plurality of semiconductor dies.

20 Claims, 7 Drawing Sheets

Related U.S. Application Data continuation of application No. 14/858,888, filed on Sep. 18, 2015, now Pat. No. 9,362,002, which is a continuation of application No. 13/502,093, filed as application No. PCT/US2010/050273 on Sep. 24, 2010, now Pat. No. 9,142,262.

(60) Provisional application No. 61/254,519, filed on Oct. 23, 2009.

(51) Int. Cl.
*H01L 25/065* (2006.01)
*G11C 11/4096* (2006.01)
*G11C 17/16* (2006.01)
*G11C 17/18* (2006.01)
*H01L 25/18* (2006.01)
*H01L 23/00* (2006.01)

(52) U.S. Cl.
CPC .............. *G11C 17/16* (2013.01); *G11C 17/18* (2013.01); *H01L 25/0657* (2013.01); *H01L 24/05* (2013.01); *H01L 24/08* (2013.01); *H01L 24/80* (2013.01); *H01L 25/18* (2013.01); *H01L 2224/05552* (2013.01); *H01L 2224/05568* (2013.01); *H01L 2224/08148* (2013.01); *H01L 2224/8013* (2013.01); *H01L 2224/80132* (2013.01); *H01L 2224/80897* (2013.01); *H01L 2225/06527* (2013.01); *H01L 2225/06541* (2013.01); *H01L 2924/0002* (2013.01); *H01L 2924/00014* (2013.01); *H01L 2924/10253* (2013.01); *H01L 2924/14* (2013.01)

(58) Field of Classification Search
USPC .......................... 365/174, 149; 257/678–733
See application file for complete search history.

(56) References Cited

U.S. PATENT DOCUMENTS

| | | | |
|---|---|---|---|
| 6,271,587 B1 | 8/2001 | Patti | |
| 6,706,546 B2 | 3/2004 | Yoshimura et al. | |
| 7,071,546 B2 | 7/2006 | Fey et al. | |
| 7,098,541 B2 | 8/2006 | Adelmann | |
| 7,208,343 B2 | 4/2007 | Song et al. | |
| 7,446,420 B1 | 11/2008 | Kim | |
| 7,816,776 B2 | 10/2010 | Choi | |
| 7,898,834 B2 | 3/2011 | Kim et al. | |
| 8,233,303 B2 | 7/2012 | Best et al. | |
| 8,258,619 B2 | 9/2012 | Foster, Sr. et al. | |
| 8,432,027 B2 | 4/2013 | Foster, Sr. et al. | |
| 8,436,477 B2 | 5/2013 | Crisp et al. | |
| 8,513,817 B2 | 8/2013 | Haba et al. | |
| 9,432,298 B1 | 8/2016 | Smith | |
| 2001/0045645 A1 | 11/2001 | Sasaki et al. | |
| 2003/0146012 A1 | 8/2003 | Song et al. | |
| 2004/0245615 A1 | 12/2004 | Cady et al. | |
| 2005/0194674 A1 | 9/2005 | Thomas et al. | |
| 2006/0205120 A1 | 9/2006 | Harari | |
| 2007/0057384 A1 | 3/2007 | Alam et al. | |
| 2007/0235851 A1 | 10/2007 | Ware et al. | |
| 2008/0031076 A1 | 2/2008 | Bartley et al. | |
| 2008/0088031 A1 | 4/2008 | Kwon et al. | |
| 2008/0130395 A1 | 6/2008 | Silvestri | |
| 2008/0220565 A1 | 9/2008 | Hsu et al. | |
| 2008/0315331 A1 | 12/2008 | Wodnicki et al. | |
| 2009/0039492 A1 | 2/2009 | Kang et al. | |
| 2009/0153177 A1* | 6/2009 | Shibata ............ G01R 31/31717 324/750.3 |
| 2009/0161401 A1 | 6/2009 | Bilger et al. | |
| 2009/0161402 A1 | 6/2009 | Oh et al. | |
| 2009/0180257 A1 | 7/2009 | Park et al. | |
| 2010/0289131 A1 | 11/2010 | Bathan et al. | |
| 2011/0050320 A1 | 3/2011 | Gillingham | |
| 2011/0148469 A1 | 6/2011 | Ito et al. | |

FOREIGN PATENT DOCUMENTS

| | | |
|---|---|---|
| WO | WO-2010-138480 A2 | 12/2010 |
| WO | WO-2011-049710 A2 | 4/2011 |
| WO | WO-2013-025205 A1 | 2/2013 |

OTHER PUBLICATIONS

International Preliminary Report on Patentability dated May 3, 2012 re Int'l Application No. PCT/US10/050273. 5 pages.

International Search Report and the written Opinion dated Jun. 9, 2011 re Int'l. Application No. PCT/US2010/050273. 8 Pages.

Kang, Uksong et al., "8Gb 3D DDR3 DRAM Using Through-Silicon-Via Technology," IEEE International Solid-State Circuits Conference, 2009. 3 pages.

\* cited by examiner

STACKED SEMICONDUCTOR DEVICE

CROSS-REFERENCE TO RELATED APPLICATIONS/TECHNICAL FIELD

This application is a Continuation of U.S. Ser. No. 15/175,933, filed Jun. 7, 2016, entitled "Stacked Semiconductor Device", which is a Continuation of U.S. Ser. No. 14/858,888, filed Sep. 18, 2015, entitled "Stacked Semiconductor Device", now U.S. Pat. No. 9,362,002, which is a Continuation of U.S. Ser. No. 13/502,093, filed Apr. 13, 2012, entitled "Stacked Semiconductor Device", now U.S. Pat. No. 9,142,262, which claims priority under 35 U.S.C. § 120 to International Application No. PCT/US2010/050273, published as WO 2011/049710 A2 on Apr. 28, 2011, which claims priority from U.S. Provisional Application No. 61/254,519, filed Oct. 23, 2009 and entitled "Stacked Semiconductor Device". Application Ser. Nos. 14/858,888, 13/502,093, International Application No. PCT/US2010/050273 and U.S. Provisional Application No. 61/254,519 are hereby incorporated by reference in their entirety. The disclosure herein relates to semiconductor devices and more particularly to stacking configurations and methods for semiconductor devices.

BACKGROUND

Semiconductor packaging often involves assembling and electrically interconnecting groups of semiconductor devices together in space-efficient, yet inexpensive ways. One packaging approach involves stacking devices to reduce the horizontal footprint of the assembled system. Conventional stacking schemes typically rely on signal redistribution layers and/or wire-bond resources to provide electrical access to and from each device. Moreover, conventional stacking arrangements often overlook power efficiency concerns.

While conventional stacking methods work well for their intended applications, the need exists for power and cost efficient stacked die arrangements and methods. Embodiments of packaged semiconductor systems and methods described herein satisfy these needs.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of systems and methods are described herein where a plurality of semiconductor devices employing through-silicon-vias are stacked to allow access of at least one of the semiconductor devices by way of through-silicon-vias in at least one other of the semiconductor devices. The through-silicon-vias are designed and device-aligned to reduce input/output (I/O) loading along a given via path. By reducing I/O loading on via paths, the system enables optimal point-to-point connections between I/O circuitry in a base device, and I/O circuitry in one of the plurality of devices. This, in turn, improves system speed and power efficiency. In one embodiment, the through-silicon-vias in each of the plurality of semiconductor devices are arranged in an array. Each semiconductor device has two opposing surfaces and a corresponding pad array on each of the opposing surfaces. The reduced I/O loading is achieved by staggering I/O circuits among a pad array and offsetting adjacent devices by at least one pad location. In other words, the two adjacent devices are offset from each other by at least the distance between two adjacent columns of pads such that the first column of the through-silicon-via array in a first one of the adjacent devices are aligned with respective ones of the second column of the through-silicon-via array in the other one of the adjacent devices, the second column of the through-silicon-via array in the first one of the adjacent devices are aligned with respective ones of the third column of the through-silicon-via array in the other one of the adjacent devices, etc. The cooperation between the staggered I/O circuits and the offsetting between adjacent devices minimizes the number of I/O circuits coupled to each via path, resulting in reduced I/O loading thereof. Alternatively, the alignment is accomplished through a straight-up stack without offsetting. In such an embodiment, the I/O circuitry is not staggered, but rather selectively enabled to reduce the I/O loadings.

Figure 1:
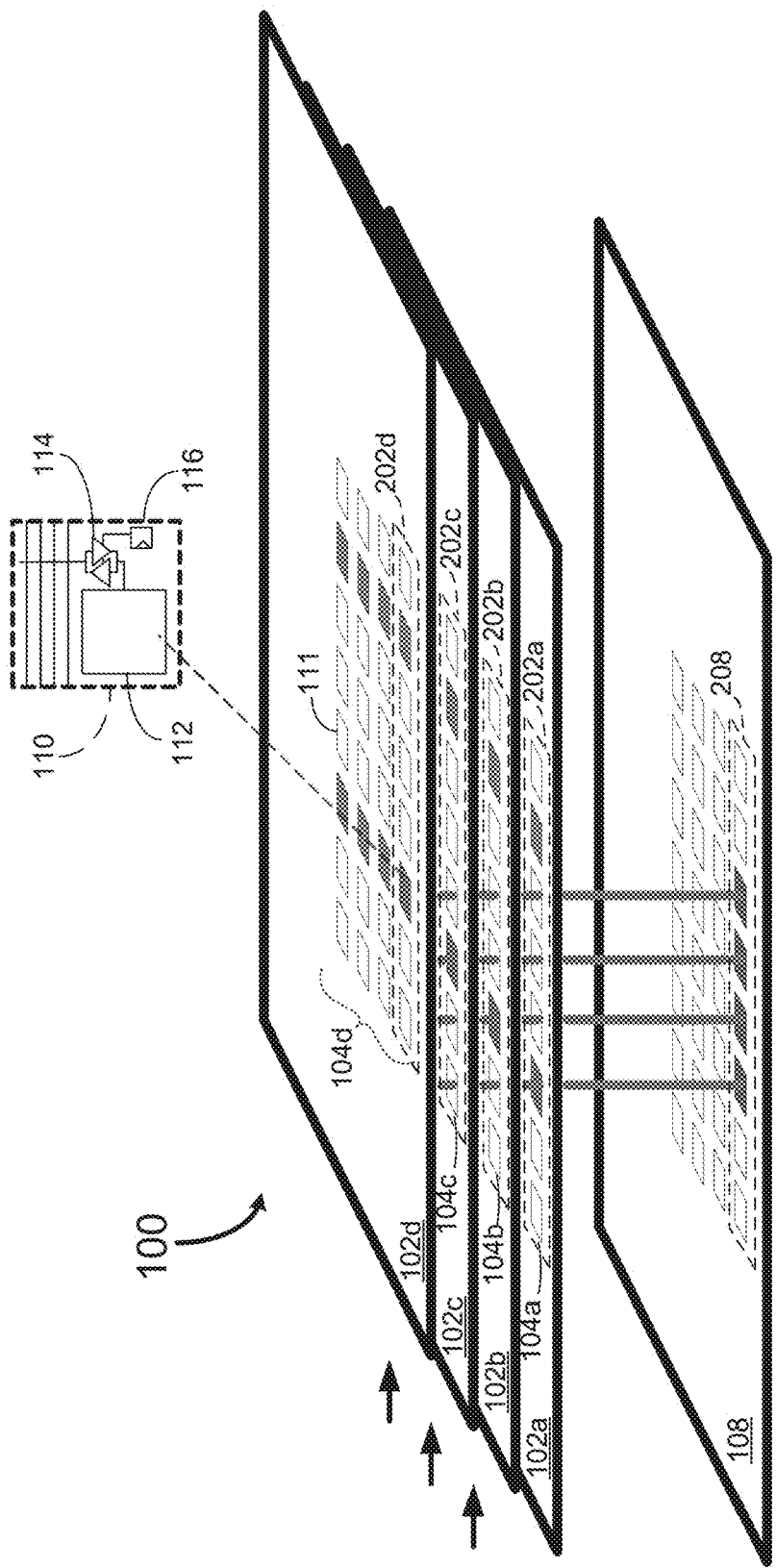
FIG. 1 illustrates a three-dimensional exploded view of a packaged semiconductor system employing stacked devices in accordance with one embodiment of the disclosure herein.
Figure 2:
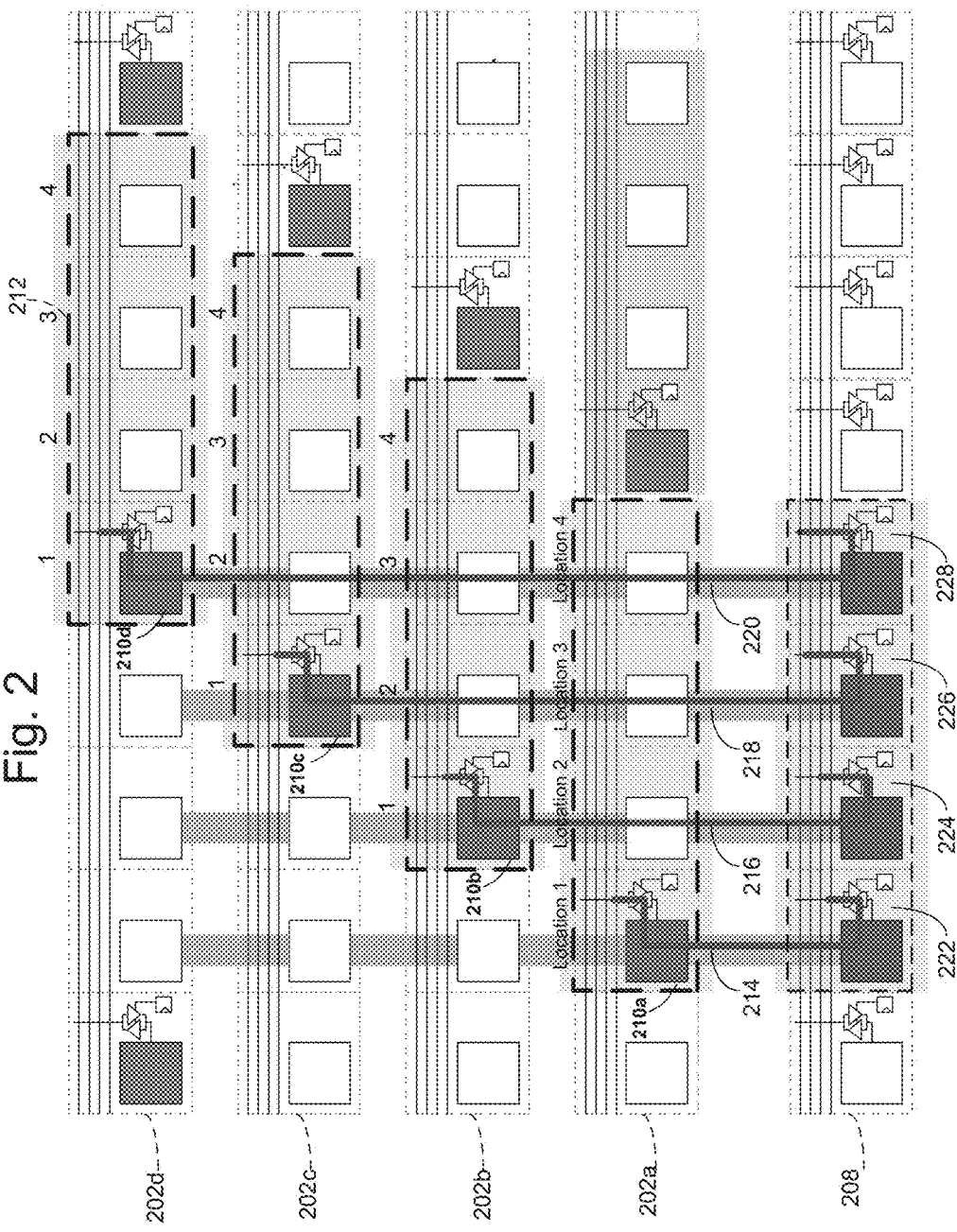
FIG. 2 illustrates a two-dimensional partial side view of the stacked device system of FIG. 1 with the pad and I/O circuitry for each device shown as if from a top plan view.
Figure 3:
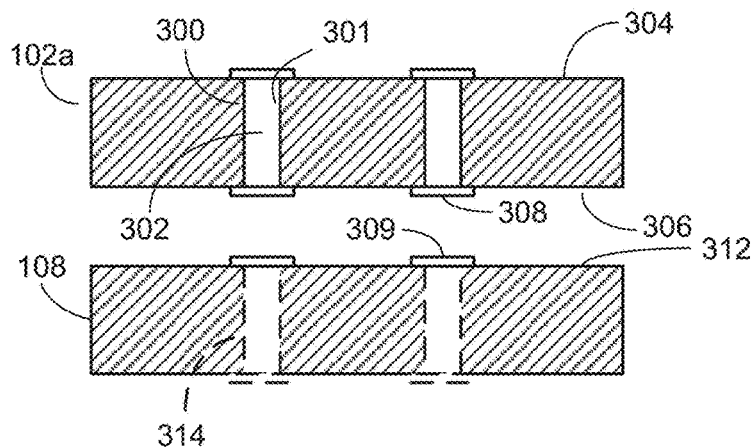
FIG. 3 illustrates a partial cross-sectional view of two semiconductor devices showing formed vias employed in the system of FIG. 1.

FIGS. 1-3 illustrate respective three-dimensional and two-dimensional views for one specific embodiment of a semiconductor die stack 100 that facilitates point-to-point interconnections while reducing power dissipation and cost. A plurality of semiconductor dies 102a-102d are provided for stacking. Each of the semiconductor dies 102a-102d has oppositely disposed first and second surfaces 304 and 306, a plurality of pads 308 formed on the first surface, a plurality of pads 308 formed on the second surface, and a plurality of through-vias 302 connecting respective pads on the first surface to respective pads on the second surface. The pads and vias are arranged in respective arrays, such as the array of pads 104a-104d on the first surfaces. The arrays of pads 104a-104d include I/O pads 112 (in magnified callout 110), which are pads coupled to corresponding I/O circuitry on the same die, and non-I/O pads, which are pads 111 not coupled to any I/O circuits on the same die. Accordingly, the array of through-vias in each semiconductor die would include a first group of through-vias coupled to respective I/O circuitry on the same semiconductor die and a second group of through-vias not coupled to I/O circuitry on the same semiconductor die.

With continued reference to FIGS. 1-3, a processor die 108 preferably forms the base of the stack 100, but may be remotely disposed therefrom as the application dictates. The processor device 108 accesses a die higher in the stack, such as die 102*c*, by way of some of the through-vias in the same die and some of the through-vias in the dies lower in the stack, such as dies 102*a* and 102*b*, i.e., these vias form via paths for accessing the die 102*c*. The processor device 108 optionally employs a via array (shown in phantom in FIG. 3) that may or may not correspond to the stacked die via arrays depending on whether the active circuitry on the processor device is facing the stack.

Further referring to FIG. 1, and more specifically the magnified callout, each of the I/O pads 110 may take one of several forms. Generally, each pad represents the area occupied by the via structure (the via post diameter in addition to the surrounding metal pad) that couples to a corresponding via structure on an adjacent silicon die. In one embodiment, each I/O pads 112 electrically couples to transmit and/or receiver circuits such as a driver/receiver pair (or transceiver) 114, and possibly electro-static-discharge (ESD) circuitry (not shown) associated with the transmit and/or receive circuits, on the same die. An optional programmable mode register 116 provides a selectable enable/disable state for the driver/receiver circuitry. The capacitive coupling of this I/O circuit type may have the ability to load a via path with capacitance on the order of hundreds of femtofarads.

In an effort to minimize the effects of I/O pad capacitance on via paths, and referring still to FIG. 1, the non-I/O pads 111 are employed. In one embodiment, the non-I/O pads are pads not having any associated I/O circuitry (e.g., driver/transceiver pair and ESD circuitry). In one embodiment, illustrated more clearly in FIG. 2, only one in every four pad locations (such as at 210) in a given row of pads 212 (in phantom) is formed with I/O circuitry, defining a staggered I/O circuit pattern. This allows for point-to-point connections between processor die 208 and up to four semiconductor dies 202*a*-202*d* stacked above the processor die 208. For ease of reference in the discussion that follows, the shaded I/O pad location for an I/O pad on each stacked device of FIG. 2 will be referred to as "Location1", with subsequent adjacent locations for non-I/O pads referred to in order as Locations 2 through 4.

In one embodiment, the point-to-point connectivity enables sizing of the I/O transceivers on the processor device for driving/receiving signals to/from one load (as opposed to multiple loads for a multi-drop configuration). The sizing may be in terms of current or voltage driving capability or the like. This, in turn, provides significant power savings, especially as the number of I/Os scale upwards for a given device stack.

With continued reference to FIG. 2, from an overall stack perspective, representations of end-to-end vias from a cross-sectional view are shown as vertically interconnected paths 214, 216, 218, and 220. From an individual device perspective, the via array generally reflects the array shape, size, and pitch exhibited by the pad array.

Referring now to FIG. 3, each TSV 300 is formed to provide a conductive path 302 oriented orthogonally between the active surface of the die 304 and the backside surface of the die 306. A raised pad structure 308 caps each via end. Pads disposed on the active surface of the die are generally formed coextensive with, and may actually define the I/O contact pads. Thus, for a given die, depending on the regular "stagger" of the I/O circuit pattern described above, a first set or group of vias will be coupled to I/O pads, while at least a portion of the rest (a second group) will be coupled to non-I/O pads on that die (no active circuitry). Note that the base die 310 in a given stack may optionally employ the via array 314 (in phantom) since its active circuitry lies on the top surface, at 312. In one embodiment, the plurality of semiconductor dies are stacked such that the first group of through-vias in a first one of the plurality of semiconductor dies (e.g., die 102*a*) are aligned with respective ones of at least a portion of the second group of through-vias in a second one of the plurality of semiconductor dies (i.e., die 102*b*).

Preferably, the semiconductor dies are identical in terms of structural form, but may differ somewhat in performance. Employing identical devices in the stack simplifies die stacking, alignment, and reduces the cost per unit through the benefits of volume manufacturing.

Referring back to FIGS. 1 and 2, in one embodiment, the plurality of semiconductor dies are substantially identical and are offset from each other to achieve alignment of the first group of through-vias in a first one of the plurality of semiconductor dies with respective ones of at least a portion of the second group of through-vias in a second one of the plurality of semiconductor dies. For example, the stacked semiconductor dies can be aligned in such a way that the TSV arrays of adjacent dies are offset by at least one pad location. The die offsets create a "stairstep" arrangement for the stack, beginning at one edge of the pad array, and progressing by at least one pad location for each subsequently stacked device. The offsets allow the vias to electrically cooperate with the I/O circuit pattern formations on each die (preferably structurally identical). This is done such that each via path 214, 216, 218, and 220 (connected at one end to processor die I/O circuits 222, 224, 226, and 228) couples to only one I/O circuit ("location 1") in only one of the stacked dies.

With continued reference to FIG. 2, the couplings from the base die I/O circuits 222, 224, 226, and 228 to each stacked die "Location1" are illustrated at 210*a*, 210*b*, 210*c*, and 210*d*. For the specific instance where four dies are to be stacked, and one of every four pad locations (in a row of pads) for each die include I/O circuitry, a single pad offset in a staircase manner results in an alignment where groups of vias not coupled to I/O circuits on their own respective die (pad locations 2, 3, and 4 for each set of four I/O locations) make electrical contact to I/O circuitry in different devices. Conversely, the alignment enables vias coupled to the I/O circuitry for pad Location 1 (for the lower-most stacked device 202*a*) to interface with groups of vias not coupled to I/O circuitry (pad locations 4, 3 and 2 of stacked devices 202*b*, 202*c* and 202*d*, respectively). In this specific manner, each via path forms a true point-to-point connection between the processor I/O circuit and one I/O circuit formed in one of the stacked semiconductor devices.

In some instances, there may be a desire to add capacity and stack additional die over and above the originally designed stack. Each additional die will preferably be formed with the appropriate TSV array, but may lack the staggered I/O pad array described above to cooperate properly with the TSV aligned offset scheme. Instead, each I/O location on the additional device may employ conventional pad I/O circuitry, including a programmable register to enable the driver/receiver circuitry. For enabled I/O circuitry, the result on the corresponding electrically coupled end-to-end via path will be a multi-drop situation. For non-enabled I/O circuits on the additional device, a capacitive loading will exist on the corresponding via (even though the active circuitry is "off"). While the added device presents a slight overall capacitive load to each via, the overall power benefit achieved by the original stack more than makes up for the loading.

In some applications, both point-to-point and multi-drop paths may need to be realized in the stacked die. Multi-drop paths are often employed in memory systems to transfer common signals such as address, command and control signals from a memory controller to memory dies. This may be done in a variety of different ways. For example, a group of adjacent I/O circuits on the processor (for example, pad locations 1-4 of the processor die) may be tied or grouped together electrically to form a super-pad such that a commonly transmitted signal is transferred to the same I/O circuit location on all of the stacked die. Another approach involves populating a stretch of via sites with I/O circuitry similar to FIG. 6, although modified such that four I/O sites are coupled from the processor 604 to sixteen I/O sites in semiconductor devices 602a-602d. Generally, the approach unscrambles the four received signals (along each row of four I/O sites) from the processor in each of the four semiconductor devices 602a-602d by rotating the four bits by 0, 1, 2, or 3 bit positions, depending on the device location in the stack.

Manufacturing the stacked semiconductor devices in accordance with the embodiment described above involves relatively straightforward fabrication methods including staggering the I/O pad pattern (with the I/O circuitry), fabricating the TSV array, and aligning the devices in a stacked relationship.

Formation of the I/O circuitry and pad array for each device may be accomplished during wafer fabrication, involving generally understood principles of integrated circuit device processing. Of interest is the notion that for each device, pad locations are preferably reserved for I/O circuitry, even if omitted. This runs counter to the trend of electrically utilizing every possible piece of silicon real estate. However, this cost is more than offset by the advantages in power savings that result. By designing the device such that the overall chip layout is identical among devices, fabrication costs due to stacked-die-specific applications may be spread out or amortized due to volume manufacturing.

Fabricating the TSV array for each device may occur at the wafer (device) level, or stacked die level. Referring again to FIG. 3, the two stacked die 310 and 311 are illustrated that each exhibit a pair of TSVs 300. Openings 301 to initially define the via shapes may be formed at the device level through a plasma or chemical etching or mechanical drilling process. At the stacked level, the via arrays may be efficiently formed by a suitable drilling method where openings are formed through all of the stacked devices in a single drilling step. Following formation of the via openings, a suitable conductor such as aluminum is deposited therein to form an electrically conductive path 302. Each end of the via is capped off with a raised pad contact 308 suitable for engaging a confronting pad contact, such as that at 309 from an adjacent stacked die. Pads formed at the active surface 304 of the die 311 electrically couple to the pad I/O locations. If I/O circuitry for a given pad was masked during I/O fabrication, then the via will not be coupled to I/O circuitry.

Figure 4:
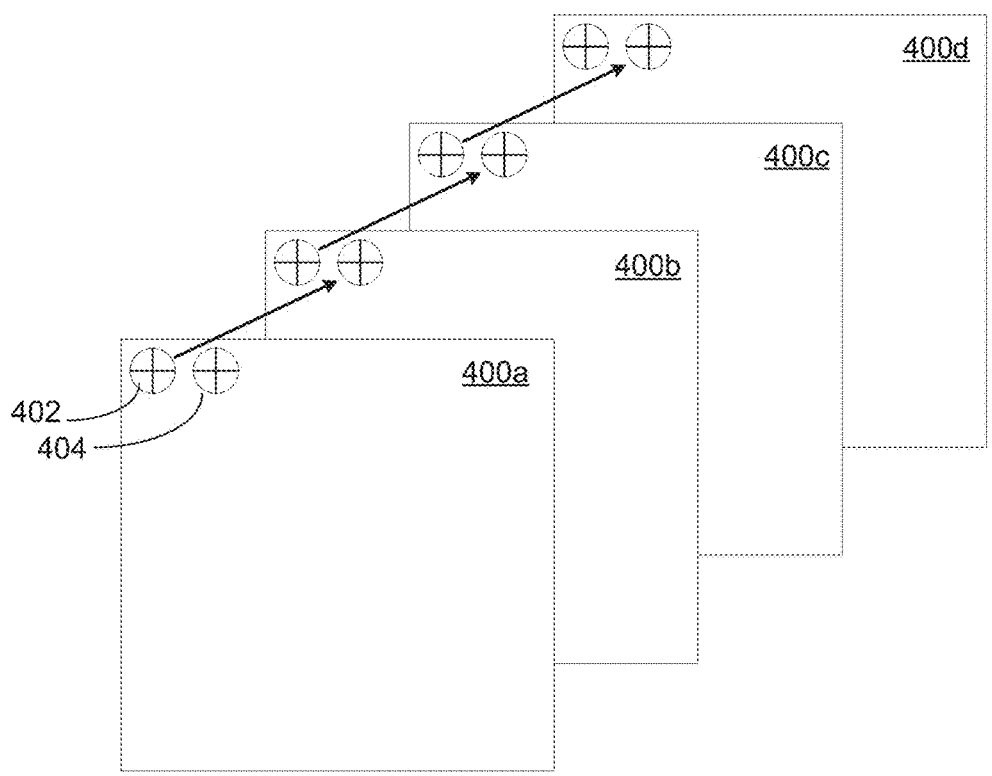
FIG. 4 illustrates a generalized top plan view of an alignment technique for offsetting the stacked semiconductor devices of FIG. 1.

Following formation of the TSV array for each die, singulated die are aligned to each other in a stacked relationship such that the TSV arrays for adjacent devices (corresponding to the pad arrays) are offset by at least one pad location. This is accomplished during assembly through well-known registration techniques, such as that shown in FIG. 4, wherein each die 400a-400d includes a pair of identically located registration reticles 402 and 404. The reticles in-turn are aligned with a pair of die pads (not shown). By aligning the leftmost reticle 402 of one die to the rightmost reticle 404 of an adjacent die (note that the dies are generally thinned and transparent during processing to allow visual alignment), a die-to-die offset of one pad may be straightforwardly achieved.

As each die is stacked in offset relationship to the die beneath it, pads from the lower surface of the upper device engage aligned pads disposed on the upper surface of the lower device. Once the stack is completely assembled, electrically conductive paths will extend orthogonally from the lowest device (typically a processor chip) up through the entire stack of identically formed dies.

In operation, the via signal paths define channels that are susceptible to various loading effects. Specifically, capacitance associated with each via affects current usage and related power efficiency parameters. However, by employing point-to-point signaling paths with the via and I/O circuit arrangement described above, each end-to-end via path electrically couples to (preferably) one I/O circuit. With each I/O circuit having the potential to load a via by a few hundred femtofarads, eliminating capacitance associated with three out of every four potential pad locations significantly improves power efficiency.

Figure 5:
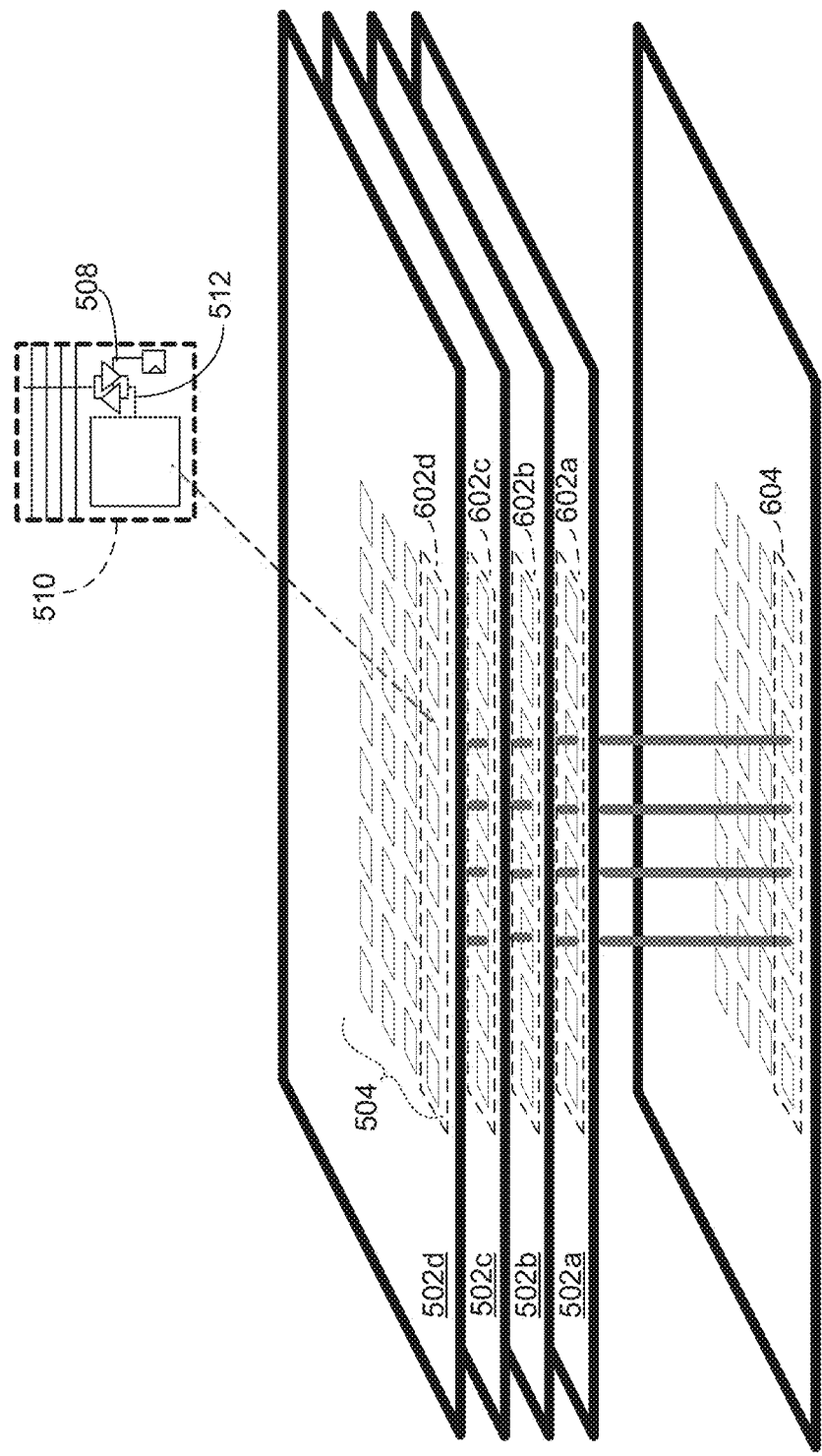
FIG. 5 illustrates a three-dimensional exploded view similar to FIG. 1 for an alternative embodiment.
Figure 6:
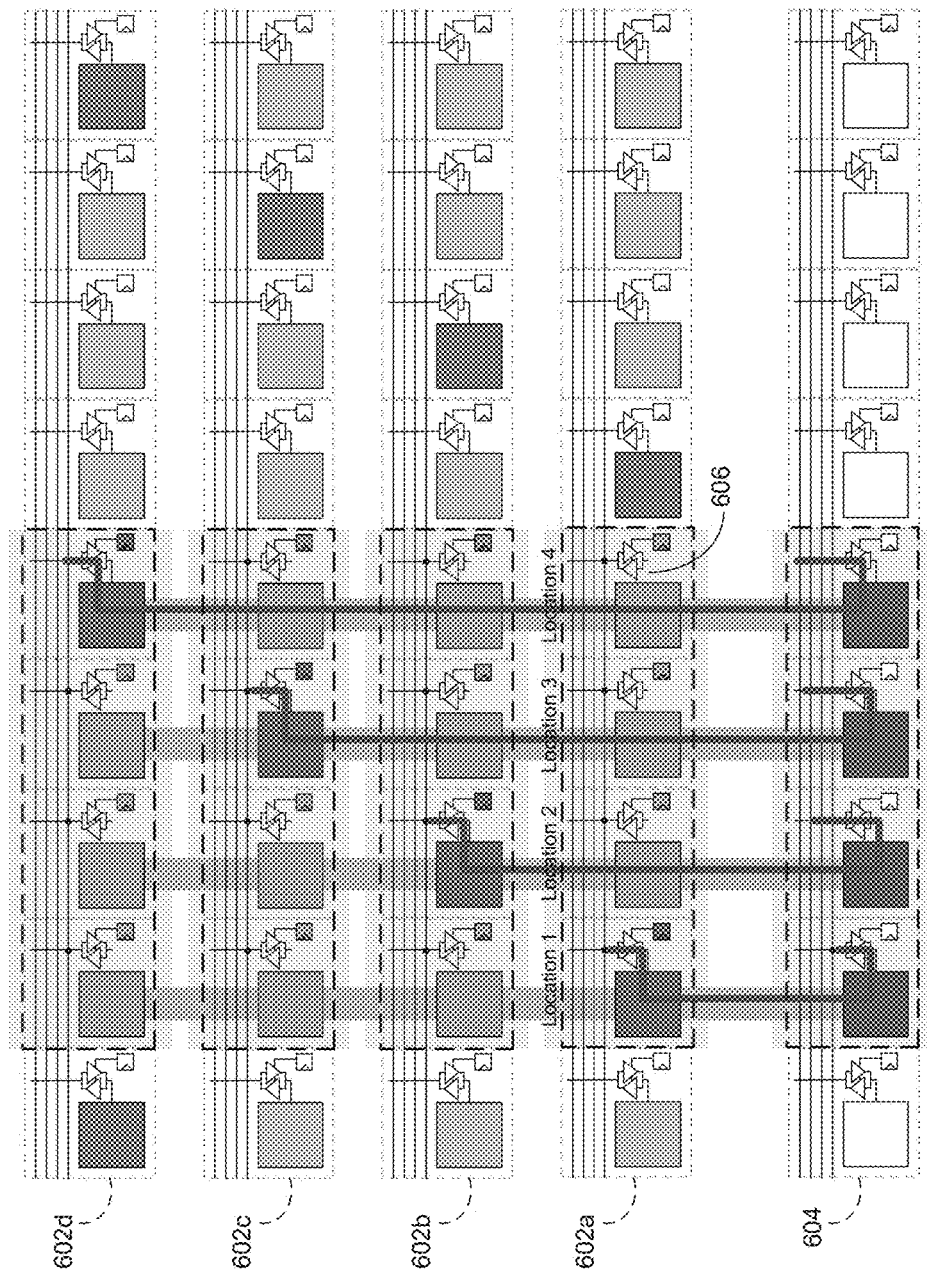
FIG. 6 shows a two-dimensional partial side view similar to FIG. 2 for the alternative embodiment of FIG. 5.

FIGS. 5 and 6 illustrate an alternative embodiment of a low power and low cost stacked die solution that avoids offsetting adjacent die like the previous embodiment illustrated in FIGS. 1-4, a plurality of semiconductor dies 502a-502d are provided and stacked. Each die includes a formed TSV array 504 that corresponds to a pad array formed on each of the opposing die surfaces, with each via oriented orthogonally to the planar die surfaces and extending from one surface to the other.

Unlike the previously described embodiment, I/O circuitry 508 may be formed at each pad location 510 (phantom), but with circuitry 512 that enables selective coupling to a given via or pad. In one embodiment, a programmable fuse or anti-fuse may be employed to electrically decouple the I/O circuitry from the I/O pad. In so doing, the capacitive loading that would normally take place with a coupled I/O circuit (even when disabled) is avoided.

Thus, for each semiconductor device, a group of vias in a given semiconductor device will electrically couple to I/O circuitry on that device, while at least a portion of the remaining vias will be electrically decoupled from I/O circuits disposed adjacent their respective via pads.

FIG. 6 illustrates the assembled alignment of stacked semiconductor dies 602a-602d with respect to a base semiconductor die 604. While each I/O pad location includes I/O circuitry, for the first stacked device 602a, respective fuses have decoupled the I/O circuitry at Locations 2, 3 and 4 from the respective I/O pads (represented by "open" connections between each pad and I/O circuitry, such as at 606). Similar de-fusings are carried out with the remaining stacked dies.

Referring back to FIGS. 5 and 6, employing programmable fuses enables a device manufacturer to avoid masking out selected I/O locations, although at a cost of creating the fuses. With all of the I/O pad locations exhibiting identical circuitry, effecting point-to-point paths with the stacked die merely involves programming the fuses appropriately, such that a single via path coupling multiple devices couples to less than all of the I/O circuits adjacent that via path. The net result of using fuses allows the die stack to take on a true vertically aligned structure, with no offsets or process steps to precisely align offsets.

Figure 7:
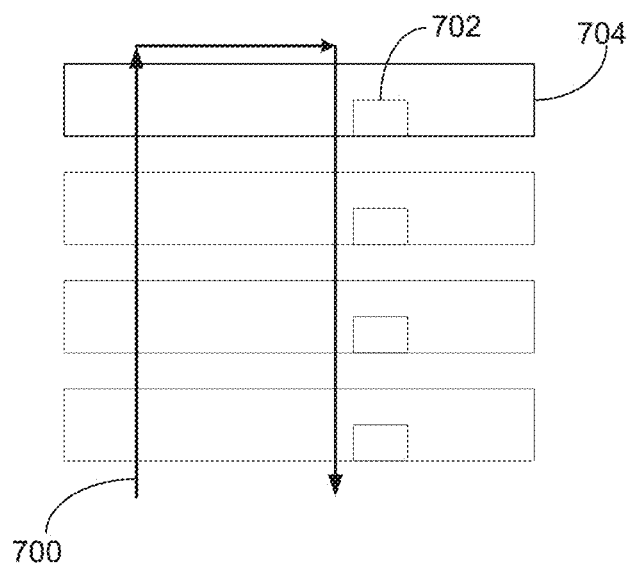
FIG. 7 illustrates the routing of a serial bus used in one embodiment of the stacked semiconductor system of FIG. 5 to initialize one or more of the stacked semiconductor devices.

One additional process step in assembling the stack in accordance with the fuse embodiment described above involves initializing the fuses to arrive at the desired coupled/decoupled structures. FIG. 7 generally illustrates how a serial bus 700 may be used in a daisy-chained manner to initialize selected fuses 702 on each die 704. Other ways to accomplish this include providing horizontal offset paths between adjacent devices to direct enable signals to the separate devices; enabling each device to measure a resistance of a given via path so that it can determine where it lies in the stack; or providing wirebond connections to drive device selection inputs.

In the embodiments described above, an emphasis on limiting the via to pad I/O electrical coupling to one circuit was applied. In practice, as long as at least one I/O circuit is decoupled from the via path, or less than all of the I/O circuits are coupled to the via path, power savings may be realized. Moreover, although point-to-point paths for the via connections were emphasized above, multi-drop connections that still provide power and cost savings may be beneficial.

Figure 8:
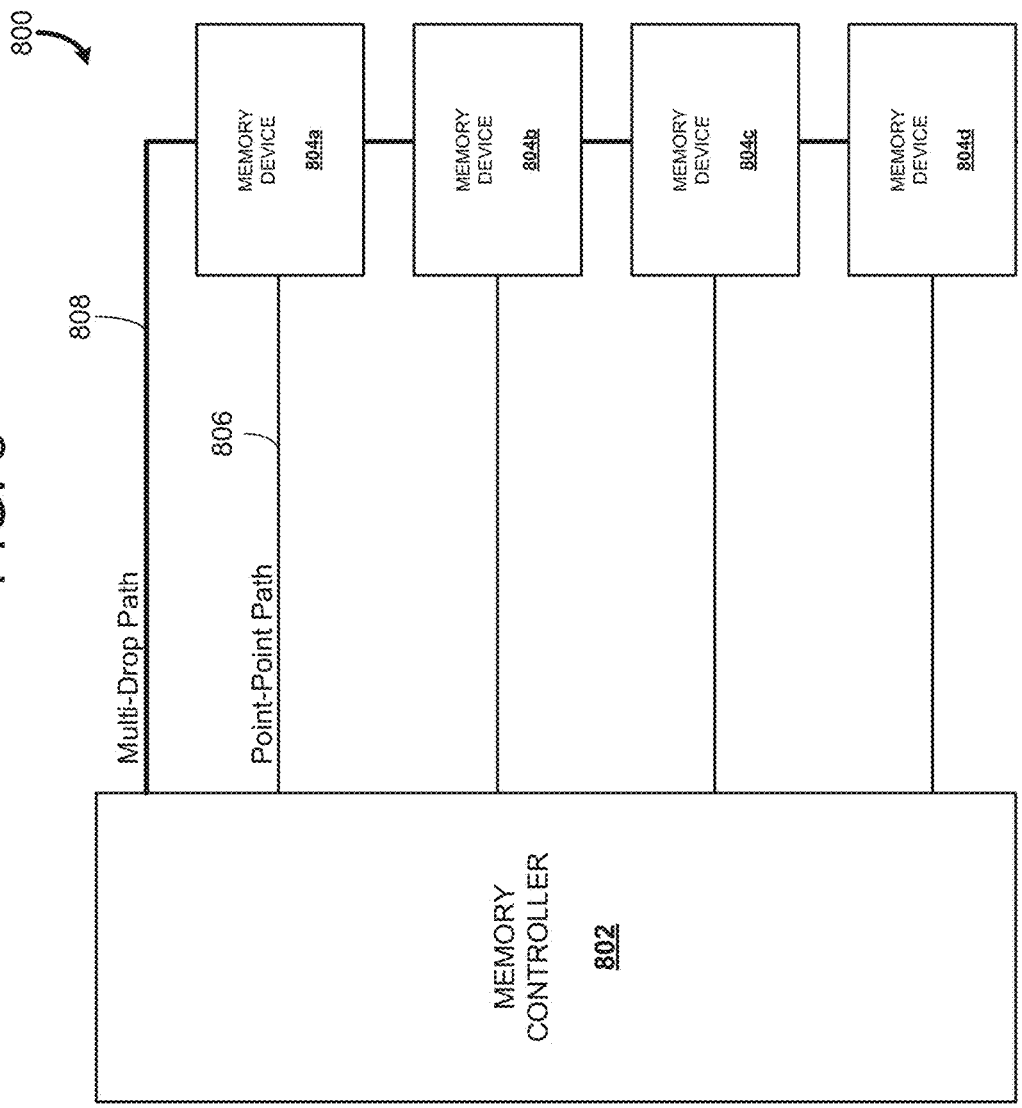
FIG. 8 shows one embodiment of a memory system employing point-to-point and multi-drop interconnection paths.

The stacked die structures described above are particularly well-suited for low-cost master-slave applications such as memory systems, where a master processing device, such as a memory controller, interfaces with a plurality of slave devices, such as memory devices. FIG. 8 illustrates one general topology for interconnecting master and slave dies in a memory system 800. The system employs an integrated circuit (IC) memory controller 802 that interfaces with a plurality of IC memory devices 804a-804d via point-to-point data buses 806 and a multi-drop address/control bus 808. The point-to-point paths generally interconnect data I/O circuitry on the controller with corresponding data I/O circuitry on each memory device. The multi-drop address/control bus routes address and control signals from the memory controller to all of the devices.

With continued reference to FIG. 8, the memory devices 804a-804d generally load the multi-drop bus in aggregate, while loading each point-to-point path individually. Preferably, dynamic random access memory (DRAM) devices are employed in the die stack with a corresponding DRAM controller. Non-volatile memory devices are also well suited to benefit from the unique die stacking arrangements disclosed herein. In addition to the system topology shown in FIG. 8, various other topologies are suitable for the embodiments described herein, such as where all of the interconnections comprise either point-to-point paths, or multi-drop paths.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A semiconductor device, comprising:
    an end die formed with an end contact, the end die configured to be disposed at one end of a vertical die stack;
    a first die formed with a first contact, the first die stacked vertically with the end die such that the first contact is disposed in vertical alignment with the end contact, the first die including first input/output (I/O) circuitry selectively coupled to the first contact;
    a second die formed with a second contact, the second die stacked vertically with the end die and the first die such that the second contact is disposed in vertical alignment with the first contact and the end contact, the second die including second I/O circuitry selectively coupled to the second contact;
    a through-silicon via path formed to electrically couple the end contact to the first contact and the second contact; and
    wherein solely one of the first I/O circuitry or the second I/O circuitry is connected to the corresponding first contact or second contact to form a point-to-point signal path with the end contact.

2. The semiconductor device according to claim 1, wherein the end contact, the first contact, and the second contact comprise integrated circuit (I/C) pads.

3. The semiconductor device according to claim 1, further comprising:
    circuitry to selectively couple each of the first and second I/O circuits to the corresponding first contact or second contact.

4. The semiconductor device according to claim 3, wherein the circuitry to selectively couple comprises:
    programmable fuse circuitry.

5. The semiconductor device according to claim 3, wherein the circuitry to selectively couple comprises:
    anti-fuse circuitry.

6. The semiconductor device according to claim 5, wherein the anti-fuse circuitry, when programmed, de-couples a given one of the first or second I/O circuits to the corresponding first contact or second contact.

7. The semiconductor device according to claim 1, wherein the first die and the second die comprise memory integrated circuit (I/C) die.

8. A memory device, comprising:
    a first memory die formed with a first contact, the first die including first input/output (I/O) circuitry selectively coupled to the first contact;
    a second memory die formed with a second contact, the second memory die stacked vertically with the first memory die such that the second contact is disposed in vertical alignment with the first contact, the second memory die including second I/O circuitry selectively coupled to the second contact;
    a through-silicon via path formed to electrically couple the first contact to the second contact; and
    wherein solely one of the first I/O circuitry or the second I/O circuitry is connected to the corresponding first contact or second contact.

9. The memory device of claim 8, further comprising:
    a logic die having a third contact, the logic die stacked vertically with the first memory die and the second memory die such that the third contact is disposed in vertical alignment with the first contact and the second contact; and
    wherein the through-silicon via path extends to the third contact in a point-to-point manner such that the solely one of the first I/O circuitry or the second I/O circuitry electrically couples to the third contact.

10. The memory device of claim 9, wherein the first contact, the second contact, and the third contact comprise integrated circuit (I/C) pads.

11. The memory device of claim 8, further comprising:
    circuitry to selectively couple each of the first I/O circuit and the second I/O circuit to the corresponding first contact or second contact.

12. The memory device of claim 11, wherein the circuitry to selectively couple comprises:
    programmable fuse circuitry.

13. The memory device of claim 11, wherein the circuitry to selectively couple comprises:
    anti-fuse circuitry.

14. The memory device of claim 13, wherein the anti-fuse circuitry, when programmed, de-couples a given one of the first or second I/O circuits to the corresponding first contact or second contact.

15. A memory device, comprising:
    multiple memory die stacked in vertical alignment, each of the multiple memory die including
        a contact, and
        input/output (I/O) circuitry selectively coupled to the contact;
    a through-silicon via formed in the multiple memory die to electrically connect each of the contacts of the multiple memory die that are in vertical alignment; and
    wherein solely one of the I/O circuitry is connected to the corresponding contact for electrical connection to the through-silicon via.

16. The memory device of claim 15, further comprising:
    a logic die having a logic contact, the logic die stacked vertically with the multiple memory die; and
    wherein the through-silicon via path extends to the logic contact in a point-to-point manner such that the solely one of the I/O circuitry of the multiple memory die electrically couples to the logic contact.

17. The memory device of claim 15, wherein each of the multiple memory die contacts and the logic contact comprise integrated circuit (I/C) pads.

18. The memory device of claim 15, wherein each of the memory die further comprises:
    circuitry to selectively couple the I/O circuit to the contact.

19. The memory device of claim 18, wherein the circuitry to selectively couple comprises:
programmable fuse circuitry.

20. The memory device of claim 18, wherein the circuitry to selectively couple comprises:
anti-fuse circuitry.

* * * * *